(12) United States Patent
Zhang et al.

(10) Patent No.: US 10,629,841 B2
(45) Date of Patent: Apr. 21, 2020

(54) DISPLAY PANEL, METHOD OF MANUFACTURING THE SAME AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Ameng Zhang, Beijing (CN); Xuewu Xie, Beijing (CN); Yu Ai, Beijing (CN); Shi Sun, Beijing (CN); Hao Liu, Beijing (CN); Bowen Liu, Beijing (CN); Yubao Kong, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 16/171,336

(22) Filed: Oct. 25, 2018

(65) Prior Publication Data
US 2019/0252636 A1 Aug. 15, 2019

(30) Foreign Application Priority Data
Feb. 11, 2018 (CN) .......................... 2018 1 0142357

(51) Int. Cl.
H01L 51/52 (2006.01)
H01L 27/32 (2006.01)
H01L 51/56 (2006.01)

(52) U.S. Cl.
CPC ........ H01L 51/5228 (2013.01); H01L 27/322 (2013.01); H01L 27/3244 (2013.01); H01L 51/5281 (2013.01); H01L 51/5284 (2013.01); H01L 51/56 (2013.01); *H01L 2251/308* (2013.01)

(58) Field of Classification Search
CPC ........................ H01L 51/5268; H01L 51/5215
See application file for complete search history.

(56) References Cited

U.S. PATENT DOCUMENTS

2008/0297045 A1* 12/2008 Cok .................. B82Y 20/00
313/506

* cited by examiner

*Primary Examiner* — Thomas L Dickey
(74) *Attorney, Agent, or Firm* — Kinney & Lange, P.A.

(57) ABSTRACT

A display panel, a method of manufacturing the display panel, and a display device are provided. The display panel includes: an electrode layer; an auxiliary electrode layer opposite to the electrode layer; and a plurality of transparent conductive particles between the electrode layer and the auxiliary electrode layer, wherein the plurality of transparent conductive particles are configured such that the electrode layer and the auxiliary electrode layer are electrically connected with each other.

16 Claims, 2 Drawing Sheets

DISPLAY PANEL, METHOD OF MANUFACTURING THE SAME AND DISPLAY DEVICE

CROSS-REFERENCE TO RELATED APPLICATION

This application claims priority to Chinese Patent Application No. 201810142357.1 filed on Feb. 11, 2018 in the State Intellectual Property Office of China, the disclosure of which is hereby incorporated by reference in its entirety.

TECHNICAL FIELD

The present disclosure relates to the field of display technologies, and in particular, to a display panel, a method of manufacturing the display panel, and a display device.

BACKGROUND

The large-sized flat panel display device has many advantages such as thin body, power saving, no radiation and the like, and has been widely used. The conventional flat panel display device mainly includes a liquid crystal display device (abbreviated as LCD) and an organic light-emitting diode (abbreviate as OLED) display device.

SUMMARY

An embodiment of the present disclosure provides a display panel comprising: an electrode layer; an auxiliary electrode layer opposite to the electrode layer; and a plurality of transparent conductive particles between the electrode layer and the auxiliary electrode layer, wherein the plurality of transparent conductive particles are configured such that the electrode layer and the auxiliary electrode layer are electrically connected with each other.

In some embodiments, the plurality of transparent conductive particles are elastic spherical transparent conductive particles.

In some embodiments, the transparent conductive particle comprises a transparent spherical resin core and a transparent conductive film coating the transparent spherical resin core.

In some embodiments, the display panel further comprising: a filling layer formed of a filler between the electrode layer and the auxiliary electrode layer, wherein the plurality of transparent conductive particles are doped in the filling layer.

In some embodiments, the transparent spherical resin core has a refractive index greater than a refractive index of the filler.

In some embodiments, the transparent spherical resin core has a refractive index in a range from 1.4 to 1.6.

In some embodiments, the transparent conductive film is an ITO film, and the auxiliary electrode layer is an ITO layer.

In some embodiments, the display panel further comprising: a first substrate; a first electrode on the first substrate; and a light-emitting layer on a side of the first electrode away from the first substrate, wherein the electrode layer is disposed on a side of the light-emitting layer away from the first electrode, and the first electrode, the light-emitting layer and the electrode layer constitute an electroluminescent device.

In some embodiments, the display panel further comprising: a second substrate opposite to the first substrate, and a black matrix on a side of the second substrate facing the first substrate, wherein the auxiliary electrode layer is disposed on a side of the black matrix away from the second substrate.

In some embodiments, the display panel further comprising: a plurality of auxiliary conductive bumps between the black matrix and the auxiliary electrode layer, wherein the plurality of auxiliary conductive bumps are configured such that a portion of the auxiliary electrode layer located on a side of the plurality of auxiliary conductive bumps away from the second substrate is closer to the electrode layer than other portions of the auxiliary electrode layer, and orthographic projections of the plurality of auxiliary conductive bumps on the second substrate are located within an orthographic projection of the black matrix on the second substrate.

In some embodiments, the black matrix has an opening region, and the display panel further comprises: a color filter layer in the opening region; and a protective layer on a side of the black matrix and the color filter layer away from the second substrate and on a side of the auxiliary electrode layer facing the second substrate.

In some embodiments, the filler is a transparent adhesive material.

In some embodiments, the panel is an OLED display panel and the light-emitting layer is an organic light-emitting layer.

An embodiment of the present disclosure provides a display device comprising the display panel according to anyone of the above embodiments.

An embodiment of the present disclosure provides a method of manufacturing a display panel, comprising: forming an electrode layer on a first substrate; forming an auxiliary electrode layer on a second substrate; forming a filling layer doped with transparent conductive particles on the electrode layer or the auxiliary electrode layer; and aligning and assembling the first substrate and the second substrate such that the filling layer doped with the transparent conductive particles is between the electrode layer and the auxiliary electrode layer and the electrode layer is electrically connected with the auxiliary electrode layer by the transparent conductive particles.

In some embodiments, the transparent conductive particles are elastic spherical transparent conductive particles.

In some embodiments, the method further comprising: forming a first electrode on the first substrate; and forming a light-emitting layer on a side of the first electrode away from the first substrate, wherein the electrode layer is formed on a side of the light-emitting layer away from the first substrate.

In some embodiments, the method further comprising: forming a black matrix having an opening region on the second substrate; forming a color filter layer in the opening region; and forming a protective layer on a side of the black matrix and the color filter layer away from the second substrate, wherein the auxiliary electrode layer is formed on a side of the protective layer away from the second substrate.

In some embodiments, the method further comprising: forming a plurality of auxiliary conductive bumps on a side of the protective layer away from the second substrate before the step of forming the auxiliary electrode layer, wherein orthographic projections of the plurality of auxiliary conductive bumps on the second substrate are located within an orthographic projection of the black matrix on the second substrate.

BRIEF DESCRIPTION OF THE DRAWINGS

The above and/or additional aspects and advantages of the present disclosure will become apparent and readily under

DETAILED DESCRIPTION OF THE EMBODIMENTS

Figure 1:
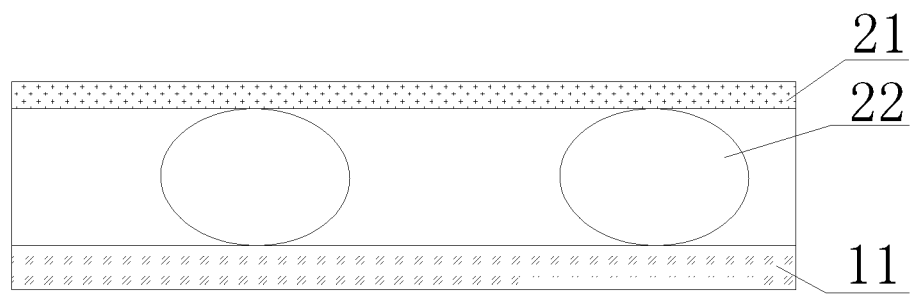
- FIG. 1 is a schematic structural view of a display panel according to an embodiment of the present disclosure.

Embodiments of the present disclosure are described in detail below, and the examples of the embodiments are illustrated in the drawings, wherein the same or similar reference numerals are used to refer to the same or similar elements or elements having the same or similar functions. The embodiments described below with reference to the accompanying drawings are intended to be illustrative only, and are not to be construed as limitations to the present disclosure.

Those skilled in the art may appreciate that the singular forms "a", "an" may include plural form unless specifically stated. It is to be understood that the phrase "include", "including", "comprise" or "comprising" used in the specification of the present disclosure means features, integers, steps, operations, components, and/or components present but does not exclude the presence or addition of one or more other features, integers, steps, operations, components, components and/or groups thereof. It will be understood that when an element is "connected" to another element, it may be directly connected to the other element, or an intermediate element may be present. The phrase "and/or" used herein includes all or any of the elements and all combinations of one or more of the associated listed elements.

Those skilled in the art will appreciate that, unless otherwise defined, all terms (including technical and scientific terms) used herein have the same meaning as commonly understood by one of ordinary skill in the art to which this disclosure belongs. It should also be understood that terms such as those defined in a general dictionary should be understood to have meaning consistent with the meaning in the context of the prior art, and will not be interpreted in an idealized or overly formal meaning unless specifically defined as here.

The OLED display device has excellent characteristics such as self-illumination, no backlight, high contrast, thin thickness, wide viewing angle, fast response, flexible panel, wide temperature range, simple structure and simple process, thus, the OLED display device has good application prospects and great market prospects. The OLED display panel generally includes a substrate, an anode disposed on the substrate, a hole injection layer disposed on the anode, a hole transport layer disposed on the hole injection layer, an organic light-emitting layer disposed on the hole transport layer, an electron transport layer disposed on the organic light-emitting layer, an electron injection layer disposed on the electron transport layer, and a cathode disposed on the electron injection layer. As holes pass through the hole injection layer and the hole transport layer and electrons pass through the electron injection layer and the electron transport layer, the holes and the electrons combine in the organic light-emitting layer to generate energy and to release photons, thereby forming self-illumination.

With the development of technology and the improvement of living standards, the demand for large-sized OLED displays is increasing. However, as the size of the display is getting larger and larger, the resistance of the cathode is also getting larger and larger. Moreover, the cathode is formed usually by vaporizing a metal material on a whole surface of the substrate in an evaporation process. Due to a portion of the cathode located in the central region of the display (i.e., a central portion of the cathode) is farther away from a cathode signal source than an edge portion of the cathode, the central portion of the cathode has a higher resistance drop (abbreviated as IR drop), so that a brightness of the center of the display panel is lower than that of the edge of the display panel, which causes uneven brightness on the entire panel, thereby restricting the development of the large-sized OLED display device.

An embodiment of the present disclosure provides a display panel. FIG. 1 shows a schematic structural view of a display panel according to an embodiment of the present disclosure. As shown in FIG. 1, the display panel includes an electrode layer 11 and an auxiliary electrode layer 21 opposite to each other, and a plurality of transparent conductive particles 22 are disposed between the electrode layer 11 and the auxiliary electrode layer 21. In this embodiment, the display panel is, for example, an OLED display panel, and the electrode layer 11 is, for example, a cathode of an OLED device in the OLED display panel. The transparent conductive particles 22 are electrically conductive, the electrode layer 11 is electrically connected to the transparent conductive particles 22, and the auxiliary electrode layer 21 is also electrically connected to the transparent conductive particles 22. The electrode layer 11 is connected in parallel with the auxiliary electrode layer 21, thereby reducing the planar resistance drop of the electrode layer 11, for example, reducing the IR drop in the central region of the electrode layer 11, so that the brightness of the central portion of the display panel coincides with that of the edge of the display panel. In addition, ambient light that is incident on the display panel from the outside may also be refracted on the transparent conductive particles 22, thereby improving the reflection effect of the display panel.

In this embodiment, both the auxiliary electrode layer 21 and the electrode layer 11 may be made of a transparent conductive material, such as ITO, so that light emitted from a light-emitting layer of the display panel may pass through the electrode layer 11, the transparent conductive particles 22 and the auxiliary electrode layer 21, which does not affect the normal display of the display panel. Since the auxiliary electrode layer 21 is connected to the electrode layer 11 through the transparent conductive particles 22, the planar resistance of the electrode layer 11 may be reduced, thereby reducing IR Drop in the plane of the electrode layer 11, for example, reducing IR Drop at the center of the electrode layer 11. In this case, the voltage applied to the entire electrode layer 11 is equalized, so that the entire display panel displays uniform brightness.

The electrode layer 11 in the display panel of the present disclosure may be a cathode of the OLED display panel, on the one hand, the cathode IR drop in the central region of the OLED display panel may be reduced, and the brightness uniformity of the OLED display panel may be improved; on the other hand, the transparent conductive particles 22 may reduce the reflection of ambient light by the OLED display panel, thereby improving the overall visual effect of the OLED display panel.

The transparent conductive particles 22 may be electrically conductive hollow bodies or conductive solid bodies. Both the auxiliary electrode layer 21 and the electrode layer 11 are transparent conductive films. In order to ensure that both the auxiliary electrode layer 21 and the electrode layer 11 are electrically connected to the transparent conductive particles 22, the auxiliary electrode layer 21 and the electrode layer 11 will both maintain a certain contact pressure with the transparent conductive particles 22. If the transparent conductive particles 22 have a rigid structure, the auxiliary electrode layer 21 and the electrode layer 11 may be damaged by the contact pressure, thereby reducing the yield of the display panel. Thus, the transparent conductive particles 22 in the present disclosure may be elastic spherical transparent conductive particles, such that the transparent conductive particles 22 may realize an electrical conduction between the auxiliary electrode layer 21 and the electrode layer 11 while avoiding rigid contact with the auxiliary electrode layer 21 and the electrode layer 11.

Figure 2:
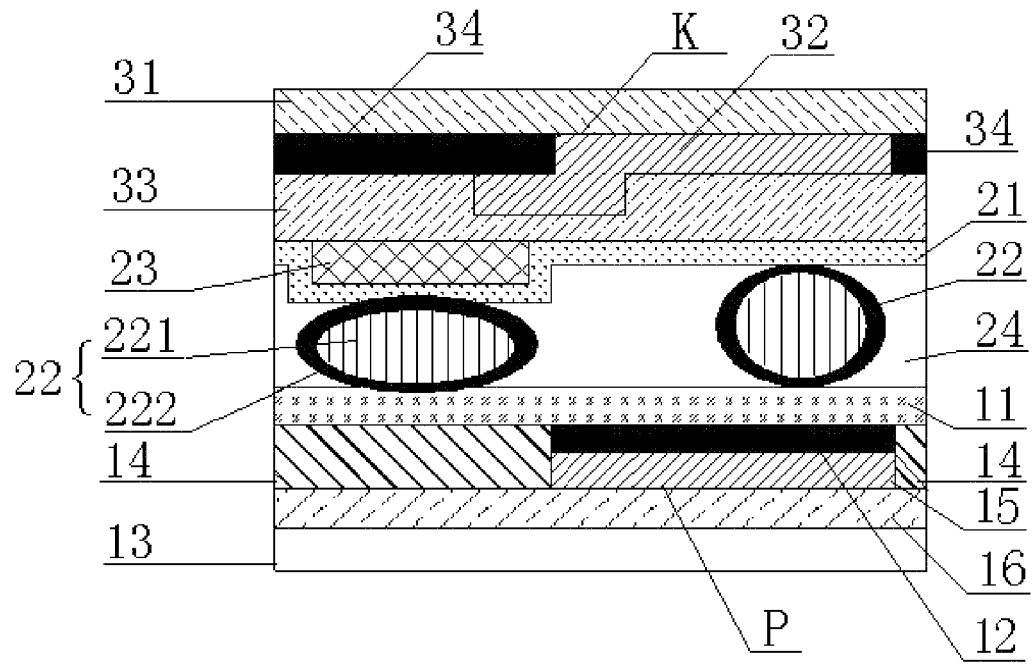
FIG. 2 is a schematic structural view of a display panel according to an embodiment of the present disclosure.

FIG. 2 shows a schematic structural view of a display panel according to an embodiment of the present disclosure. With reference to FIG. 2, the transparent conductive particle 22 includes a transparent spherical resin core 221 and a transparent conductive film 222 coating the outside surface of the transparent spherical resin core 221. The transparent spherical resin core 221 has a certain elastic deformation ability, which may reduce damage to the auxiliary electrode layer 21 and the electrode layer 11, and improve the yield of the display panel. Meanwhile, the transparent conductive film 222 outside the transparent spherical resin core 221 may electrically connect the auxiliary electrode layer 21 to the electrode layer 11, and the IR drop of the electrode layer 11 may be reduced.

In an embodiment, the transparent conductive film 222 may be made of material having good light transmittance and conductivity, for example, the transparent conductive film 222 may be a pure metal film, an ITO film, a ZnO film, an $In_2O_3$ film, or the like. In order to improve the light transmittance of the display panel and shorten the time for forming the transparent conductive film 222, the transparent conductive film 222 may be an ITO film and may be made of the same material as the electrode layer 11.

In an embodiment, the auxiliary electrode layer 21 may be an ITO layer, or a layer formed of a transparent conductive material such as ZnO, $In_2O_3$, or the like.

In an embodiment of the present disclosure, in order to facilitate forming the transparent conductive particles 22 between the electrode layer 11 and the auxiliary electrode layer 21, the display panel further includes a filling layer 24. In particular, the filling layer 24 is disposed between the electrode layer 11 and the auxiliary electrode layer 21, and the transparent conductive particles 22 is doped into the filling layer 24. In this embodiment, the transparent conductive particles 22 may be uniformly doped in advance in a filler of the filling layer 24, so that the transparent conductive particles 22 are uniformly dispersed between the electrode layer 11 and the auxiliary electrode layer 21 after forming the filling layer 24 on the electrode layer 11 or the auxiliary electrode layer 21 and aligning and assembling the electrode layer 11 and the auxiliary electrode layer 21.

In an embodiment, the transparent conductive particle 22 includes a transparent spherical resin core 221 and a transparent conductive film 222 coating the outside surface of the transparent spherical resin core 221. The display panel further includes a filling layer 24 formed of a filler, and the filling layer 24 is disposed between the electrode layer 11 and the auxiliary electrode layer 21. The transparent conductive particles 22 are doped in the filling layer 24. The transparent spherical resin core 221 has a greater refractive index than the filler. With reference to FIG. 2, in this embodiment, some transparent conductive particles 22 are located directly above the light-emitting layer 12. Since the film thickness of the transparent conductive film 222 is thin, light may propagate from an optically thinner medium (the filling layer 24) to an optically denser medium (the transparent conductive particle 22) when the light emitted from the light-emitting layer 12 passes through the filling layer 24 and the transparent conductive particles 22, so that the spherical structure of the transparent conductive particles 22 may serve to concentrate light. In this case, the light emitted from the light-emitting layer 12 in various directions is concentrated toward a light-transmitting region of the display panel under the action of the transparent conductive particles 22 so that the light emitted from light-emitting layer is more fully emitted, thereby improving the light extraction efficiency of the display panel.

In an embodiment, the transparent spherical resin core 221 has a refractive index in a range from 1.4 to 1.6, and may include an epoxy resin, an acrylic resin, or the like. In an example, the transparent spherical resin core 221 includes an acrylic resin.

In an embodiment, in order to facilitate forming the filling layer 24, the filling layer 24 includes an insulating transparent adhesive material, that is, the insulating transparent adhesive material serves as the filler of the filling layer 24. In this case, on the one hand, the transparent conductive particles 22 are uniformly dispersed in the filling layer 24, and on the other hand, the electrode layer 11 and the auxiliary electrode layer 21 are bonded and sealed by the filling layer 24.

In an embodiment, as shown in FIG. 2, the display panel further includes a first substrate 13 and an insulating layer 16 disposed on the first substrate 13. The first substrate 13 is, for example, a transparent glass substrate. A pixel defining layer 14 is disposed on a side of the insulating layer 16 away from the first substrate 13, and defines a plurality of pixel regions P. FIG. 2 shows only one pixel region. A first electrode 15, such as an anode, is disposed in the pixel region P. A light-emitting layer 12, for example, an organic light-emitting layer, is also disposed in the pixel region P, and the light-emitting layer 12 is disposed on a side of the first electrode 15 away from the first substrate 13. An electrode layer 11, for example, a cathode, is disposed on a side of the light-emitting layer 12 away from the first substrate 13, and the electrode layer 11 is a planar electrode formed on the entire surface of the first substrate 13 and covers both the pixel defining layer 14 and the light-emitting layer 12. The first electrode, the light-emitting layer and the electrode layer constitute an electroluminescent device, such as an OLED device. In an embodiment, as shown in FIG. 2, the display panel further includes a second substrate 31 opposite to the first substrate 13. A black matrix 34 is disposed on a side of the second substrate 31 facing the first substrate 13, and an orthographic projection of the black matrix 34 on the first substrate 13 may coincide with an orthographic projection of the pixel defining layer 14 on the first substrate 13, alternatively, the orthographic projection of the black matrix 34 on the first substrate 13 is slightly larger than the orthographic projection of the pixel defining layer 14 on the first substrate 13. The black matrix 34 has an opening region K corresponding to the pixel region P and located directly above the pixel region P. For example, an orthographic projection of the opening region K on the first substrate 13 coincides with an orthographic projection of the pixel region P on the first substrate 13, alternatively, the orthographic projection of the opening region K on the first substrate 13 is slightly smaller than the orthographic projection of the pixel region P on the first substrate 13, that is the orthographic projection of the opening region K on the first substrate 13 falls within the orthographic projection of the pixel region P on the first substrate 13.

A color filter layer 32 is disposed on a side of the second substrate 31 facing the first substrate 13, and at least a portion of the color filter layer 32 is disposed in the opening region K. As shown in FIG. 2, the color filter layer 32 partially overlaps the black matrix 34. The display panel further includes a protective layer 33 and an auxiliary electrode layer 21. The protective layer 33 is disposed on a side of both the black matrix 34 and the color filter layer 32 away from the second substrate 31, and the auxiliary electrode layer 21 is disposed on a side of the protective layer 33 away from the second substrate 31. The second substrate 31 is a transparent substrate, such as a glass substrate. The protective layer 33 may be a passivation layer, a buffer layer or an insulating layer or the like. The protective layer 33 may protect the color filter layer and planarize a surface on which the auxiliary electrode layer 21 is formed, so as to facilitate forming the auxiliary electrode layer 21. In an embodiment, the transparent conductive particles 22 may converge the light emitted from the light-emitting layer 12 to the opening region K where the color filter layer 32 of the display panel is located to enable the light to be emitted outward through the color filter layer 32, thereby improving the light extraction efficiency of the display panel.

In an embodiment, as shown in FIG. 2, a plurality of auxiliary conductive bumps 23 are disposed between the protective layer 33 and the auxiliary electrode layer 21. A distance between the auxiliary conductive bumps 23 and the electrode layer 11 is less than a distance between the protective layer 33 and the electrode layer 11. In this case, the auxiliary electrode layer 21 is disposed on a side of both the protective layer 33 and the auxiliary conductive bumps 23 away from the second substrate 31, and the auxiliary conductive bumps 23 are configured such that a portion of the auxiliary electrode layer 21 on the side of the plurality of auxiliary conductive bumps 23 away from the second substrate 31 is closer to the electrode layer 11 than the other portions of the auxiliary electrode 21. An orthographic projection of each of the auxiliary conductive bumps 23 on the second substrate 31 is located within an orthographic projection of the black matrix 34 on the second substrate 31, alternatively, the orthographic projection of each of the auxiliary conductive bumps 23 on the second substrate 31 coincides with the orthographic projection of the black matrix 34 on the second substrate 31. In a process of aligning and assembling the auxiliary electrode layer 21 and the electrode layer 11, there may be a gap between the transparent conductive particles 22 and the auxiliary electrode layer 21 or between the transparent conductive particles 22 and the electrode layer 11 due to a dimensional error of the transparent conductive particles 22, the tolerance of the bonding process or the aligning and assembling process, and the like. As a result, it may cause abnormality in some regions of the display panel, for example, the auxiliary electrode layer 21 and the electrode layer 11 are not electrically connected, conduction points between the auxiliary electrode layer 21 and the electrode layer 11 are poorly contacted, or a conduction path between the auxiliary electrode layer 21 and the electrode layer 11 is easily broken. Thus, the IR drop of the electrode layer 11 is affected, resulting in poor display performance of the display panel. In this embodiment, by providing a plurality of auxiliary conductive bumps 23, the distance between the auxiliary electrode layer 21 and the electrode layer 11 is reduced in regions where the auxiliary conductive bumps 23 are disposed. In these regions, the distance between the auxiliary electrode layer 21 and the electrode layer 11 is smaller than the diameter of the transparent conductive particle 22, so that the transparent conductive particles 22 are pressed and elastically deformed in these regions, thereby ensuring the electrical conduction between the auxiliary electrode layer 21 and the electrode layer 11 and maintaining conduction stability by a large contact force in these regions.

In an embodiment, the auxiliary conductive bumps 23 are located in regions shielded by the black matrix 34, and the orthographic projection of each of the auxiliary conductive bumps 23 on the second substrate 31 falls within the orthographic projection of the black matrix 34 on the second substrate 31, alternatively, the orthographic projection of the auxiliary conductive bumps 23 on the second substrate 31 coincides with the orthographic projection of the black matrix 34 on the second substrate 31, so that the auxiliary conductive bumps 23 do not affect the light emitted from the light-emitting layer 12, and do not cause a poor display performance, such as specular reflection on a light-emitting side of the display panel.

In an embodiment, the auxiliary conductive bump 23 may be conductive, which may further reduce the IR drop of the electrode layer 11. The auxiliary conductive bump 23 may be made of a metal material having a lower resistivity than the electrode layer 11 and the auxiliary electrode layer 21. In other embodiments, the auxiliary conductive bumps 23 may be replaced with non-conductive auxiliary bumps to ensure electrical conduction between the auxiliary electrode layer 21 and the electrode layer 11.

In an embodiment, the pixel defining layer 14 is made of an opaque material, in this case, the black matrix 34 may be omitted.

In the display panel provided by the foregoing embodiments, the light emitted by the light-emitting layer 12 is, for example, white light. In order to realize color display, it is necessary to provide the color filter layer. In other embodiments, the light emitted by the light-emitting layer 12 may be monochromatic light, such as a red, green or blue light. In this case, color display may be realized without setting the color filter layer, and the color filter layer 32 in FIG. 2 may be omitted or replaced by a transparent layer.

In the foregoing embodiments, the display panel is exemplified by an OLED display panel, and the light-emitting layer 12 is an organic light-emitting layer. In other embodiments, the display panel may also be a polymer light-emitting diode (abbreviated as PLED) display panel, a quantum dot light-emitting diode (abbreviated as QLED) display panel, or the like.

Figure 3:
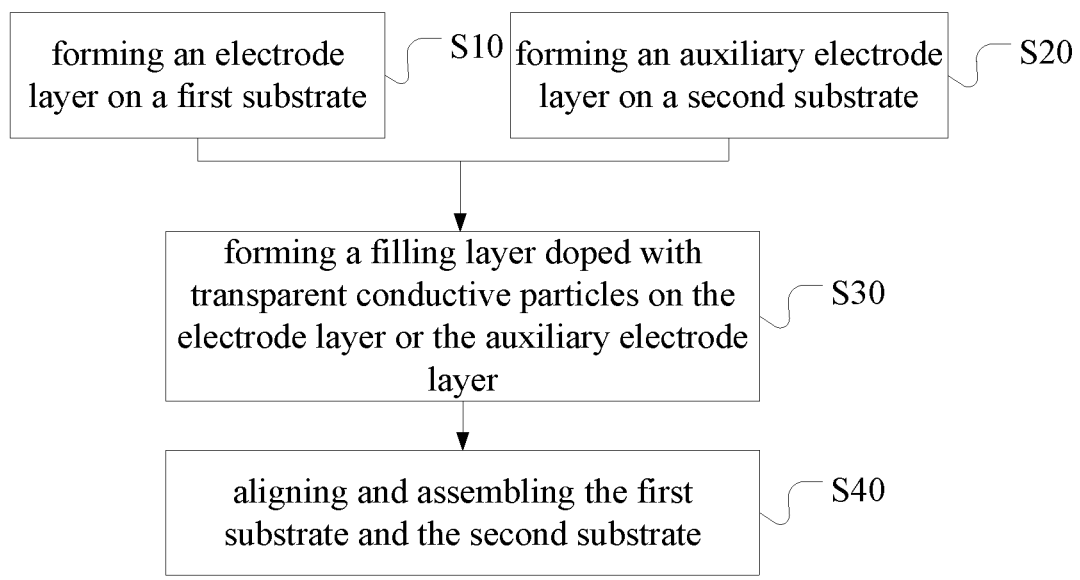
FIG. 3 is a flowchart of a method of manufacturing a display panel according to an embodiment of the present disclosure.

An embodiment of the present disclosure provides a method of manufacturing a display panel, as shown in FIG. 2 and FIG. 3, including the following steps:

step S10: forming an electrode layer on a first substrate;

step S20: forming an auxiliary electrode layer on a second substrate;

step S30: forming a filling layer doped with transparent conductive particles on the electrode layer or the auxiliary electrode layer; and step S40: aligning and assembling the first substrate and the second substrate such that the filling layer doped with the transparent conductive particles is between the electrode layer and the auxiliary electrode layer, and the electrode layer and the auxiliary electrode layer are electrically connected with each other by the transparent conductive particles.

In an embodiment, the sequence of step S10 and step S20 may be reversed. For example, step S10 is performed before step S20; optionally, step S20 is performed before step S10; optionally, step S10 and step S20 may be performed in the same time.

As shown in FIG. 2, in step S10, the electrode layer 11 is disposed on the first substrate to serve as a cathode electrode layer 11 of the OLED device, for example, an ITO layer, which is formed by a sputtering process. In step S20, the auxiliary electrode layer 21 may be formed directly on the transparent second substrate 31, and may also be formed on a side of the protective layer 33 away from the second substrate 31. The auxiliary electrode layer 21 may be formed by a sputtering process. When the auxiliary electrode layer 21 is an ITO layer, it may be formed by a conventional ITO sputtering process. The first substrate 13 provided with the electrode layer 11 and the second substrate 31 provided with the auxiliary electrode layer 21 are aligned and assembled by a conventional aligning/assembling process with low cost.

In step S30, in order to improve the uniformity of the distribution of the transparent conductive particles 22, the transparent conductive particles 22 may be uniformly doped in advance in a filler, and then the filler is coated on the electrode layer 11 or the auxiliary electrode layer 21.

In an embodiment, the transparent conductive particles 22 are elastic spherical transparent conductive particles.

In an embodiment, the filling layer 24 comprises an insulating transparent adhesive material. In step S30, the electrode layer 11 or the auxiliary electrode layer 21 is uniformly coated with the insulating transparent adhesive material doped with the transparent conductive particles 22 by a coating process. When the first substrate 13 provided with the electrode layer 11 and the second substrate 31 provided with the auxiliary electrode layer 21 are aligned and assembled, the transparent conductive particles 22 are pressed between the electrode layer 11 and the auxiliary electrode layer 21, so that the electrode layer 11 is electrically connected to the auxiliary electrode layer 21, thereby reducing IR drop of the electrode layer 11 and improving the light extraction efficiency of the display panel.

In an embodiment, before step S10, the method of manufacturing the display panel may further include the following steps:

step S01: forming a first electrode on the first substrate; and step S02: forming a light-emitting layer on a side of the first electrode away from the first substrate.

In this case, the electrode layer is formed on a side of the light-emitting layer away from the first substrate.

In step S01, a first electrode 15 is formed on the first substrate 13 by a patterning process, and the first electrode 15 may serve as an anode of the OLED device. The first electrode 15 may be formed, for example, on a side of an insulating layer 16 away from the first substrate 13 and in a pixel region P defined by a pixel defining layer 14.

In step S02, the light-emitting layer 12 is formed on the first electrode 15 by a vapor deposition, and the light-emitting layer 12 is, for example, an organic light-emitting layer. In an embodiment, before step S20, the method of manufacturing the display panel may further include the following steps:

S11: forming a black matrix having an opening region on the second substrate;

S12: forming a color filter layer in the opening region;

S13: forming a protective layer on a side of both the black matrix and the color filter layer away from the second substrate; and S14: forming a plurality of auxiliary conductive bumps on a side of the protective layer away from the second substrate.

In this case, the auxiliary electrode layer 21 is formed on the side of both the plurality of auxiliary conductive bumps 23 and the protective layer 33 away from the second substrate 31.

In step S11, the black matrix 34 is formed on the second substrate by a patterning process and has an opening region K.

In step S12, the color filter layer is formed in the opening region by a patterning process, and the color filter layer may be one of red, green or blue.

In step S13, the protective layer 33 is entirely deposited on the side of both the black matrix 34 and the color filter layer 32 away from the second substrate 31, completely covering the black matrix 34 and the color filter layer 32.

In step S14, the auxiliary conductive bumps 23 are formed on the side of the protective layer 33 away from the second substrate 31 by a patterning process.

The present disclosure also provides a display device including any one of display panels in the foregoing embodiments. The display device may be any product or component having a display function such as a display panel, an electronic paper, a mobile phone, a tablet computer, a television, a display, a notebook computer, a digital photo frame, a navigator, and the like.

The above is only a part of the embodiments of the present disclosure, and it should be noted that those skilled in the art may also make some improvements and modifications without departing from the principles of the present disclosure. These improvements and modifications should also be considered within the scope of this disclosure.

What is claimed is:

1. A display panel comprising:
   an electrode layer;
   an auxiliary electrode layer opposite to the electrode layer; and
   a plurality of transparent conductive particles between the electrode layer and the auxiliary electrode layer,
   wherein the plurality of transparent conductive particles are configured such that the electrode layer and the auxiliary electrode layer are electrically connected with each other,
   wherein the display panel further comprises:
   a first substrate;
   a first electrode on the first substrate;
   a light-emitting layer on a side of the first electrode away from the first substrate;
   a second substrate opposite to the first substrate, and
   a black matrix on a side of the second substrate facing the first substrate,
   wherein the electrode layer is disposed on a side of the light-emitting layer away from the first electrode, and the first electrode, the light-emitting layer and the electrode layer constitute an electroluminescent device, and
   wherein the auxiliary electrode layer is disposed on a side of the black matrix away from the second substrate.

2. The display panel according to claim 1, wherein the plurality of transparent conductive particles are elastic spherical transparent conductive particles.

3. The display panel according to claim 1, wherein each of the transparent conductive particles comprises a transparent spherical resin core and a transparent conductive film coating the transparent spherical resin core.

4. The display panel according to claim 3, further comprising:

a filling layer formed of a filler between the electrode layer and the auxiliary electrode layer, wherein the plurality of transparent conductive particles are doped in the filling layer.

5. The display panel according to claim 4, wherein the transparent spherical resin core has a refractive index greater than a refractive index of the filler.

6. The display panel according to claim 5, wherein the transparent spherical resin core has a refractive index in a range from 1.4 to 1.6.

7. The display panel according to claim 4, wherein the filler is a transparent adhesive material.

8. The display panel according to claim 3, wherein the transparent conductive film is an indium tin oxide (ITO) film, and the auxiliary electrode layer is an ITO layer.

9. The display panel according to claim 1, further comprising:

a plurality of auxiliary conductive bumps between the black matrix and the auxiliary electrode layer, wherein the plurality of auxiliary conductive bumps are configured such that a portion of the auxiliary electrode layer located on a side of the plurality of auxiliary conductive bumps away from the second substrate is closer to the electrode layer than other portions of the auxiliary electrode layer, and orthographic projections of the plurality of auxiliary conductive bumps on the second substrate are located within an orthographic projection of the black matrix on the second substrate.

10. The display panel according to claim 1, wherein the black matrix has an opening region, and the display panel further comprises:

a color filter layer in the opening region; and a protective layer on a side of the black matrix and the color filter layer away from the second substrate and on a side of the auxiliary electrode layer facing the second substrate.

11. The display panel according to claim 1, wherein the display panel is an OLED display panel and the light-emitting layer is an organic light-emitting layer.

12. A display device comprising the display panel according to claim 1.

13. A method of manufacturing a display panel, comprising:

forming an electrode layer on a first substrate;

forming an auxiliary electrode layer on a second substrate;

forming a filling layer doped with transparent conductive particles on the electrode layer or the auxiliary electrode layer; and aligning and assembling the first substrate and the second substrate such that the filling layer doped with the transparent conductive particles is between the electrode layer and the auxiliary electrode layer and the electrode layer is electrically connected with the auxiliary electrode layer by the transparent conductive particles, wherein the method further comprises:

forming a black matrix having an opening region on the second substrate;

forming a color filter layer in the opening region; and forming a protective layer on a side of the black matrix and the color filter layer away from the second substrate, and wherein the auxiliary electrode layer is formed on a side of the protective layer away from the second substrate.

14. The method according to claim 13, wherein the transparent conductive particles are elastic spherical transparent conductive particles.

15. The method according to claim 13, further comprising:

forming a first electrode on the first substrate; and forming a light-emitting layer on a side of the first electrode away from the first substrate, wherein the electrode layer is formed on a side of the light-emitting layer away from the first substrate.

16. The method according to claim 13, further comprising:

forming a plurality of auxiliary conductive bumps on a side of the protective layer away from the second substrate before the step of forming the auxiliary electrode layer, wherein orthographic projections of the plurality of auxiliary conductive bumps on the second substrate are located within an orthographic projection of the black matrix on the second substrate.

* * * * *